US012808914B2

(12) United States Patent
Chu et al.

(10) Patent No.: US 12,808,914 B2
(45) Date of Patent: Nov. 24, 2026

(54) METHOD AND SYSTEM FOR ANTENNA MEASUREMENT

(71) Applicant: Ohmplus Technology Inc., New Taipei (TW)

(72) Inventors: Chih-Yuan Chu, New Taipei (TW); Chih-Wei Chiu, New Taipei (TW); Zhao-He Lin, New Taipei (TW)

(73) Assignee: Ohmplus Technology Inc., New Taipei (TW)

( * ) Notice: Subject to any disclaimer, the term of this patent is extended or adjusted under 35 U.S.C. 154(b) by 141 days.

(21) Appl. No.: 19/071,775

(22) Filed: Mar. 6, 2025

(65) Prior Publication Data

US 2025/0327846 A1 Oct. 23, 2025

Related U.S. Application Data

(60) Provisional application No. 63/637,316, filed on Apr. 22, 2024.

(51) Int. Cl.
*G01R 29/08* (2006.01)

(52) U.S. Cl.
CPC ................................ *G01R 29/0892* (2013.01)

(58) Field of Classification Search
CPC .................................................. G01R 29/0892
See application file for complete search history.

(56) References Cited

U.S. PATENT DOCUMENTS

| | | | | |
|---|---|---|---|---|
| 11,237,197 | B1 * | 2/2022 | Martens | G01R 27/28 |
| 2009/0153158 | A1 * | 6/2009 | Dunn | G01R 31/2822 324/762.01 |
| 2015/0241493 | A1 * | 8/2015 | Canne | G01R 29/0814 324/612 |

* cited by examiner

*Primary Examiner* — Sung S Ahn
(74) *Attorney, Agent, or Firm* — ScienBiziP, P.C.

(57) ABSTRACT

Methods and systems for antenna measurement are provided. The method includes combining a first signal comprising a first local oscillator (LO) signal from a modulation/demodulation module with a first intermediate frequency (IF) signal group from a signal analysis module to generate a second signal. The second signal is provided to an antenna module under test to generate a radio frequency (RF) signal. A receiving antenna module receives the RF signal. An up/down conversion module demodulates the received RF signal by using a second LO signal from a signal generation module to generate a second IF signal group. The signal analysis module processes the second IF signal group to obtain antenna measurement information.

18 Claims, 2 Drawing Sheets

METHOD AND SYSTEM FOR ANTENNA MEASUREMENT

CROSS-REFERENCE TO RELATED APPLICATION(S)

The present disclosure claims the benefit of and priority to U.S. Provisional Patent Application Ser. No. 63/637,316, filed on Apr. 22, 2024, entitled "SYSTEM AND METHOD FOR ANTENNA MEASUREMENT," the content of which is hereby incorporated herein fully by reference into the present application for all purposes.

FIELD

The present disclosure relates to antenna measurement, and more particularly, to methods and systems for antenna measurement.

BACKGROUND

In modern wireless communication systems, antenna designs have become increasingly complex, leading to heightened measurement requirements. However, traditional antenna measurement methods may face efficiency limitations. To measure antenna characteristics at different operating frequencies, test personnel may need to repeatedly adjust measurement settings. This repetitive adjustment process may not only significantly extend the overall measurement time but may also affect the consistency of measurement results due to frequent setting changes, thus potentially reducing measurement reliability. Therefore, improving measurement efficiency has become an important focus in the industry.

SUMMARY

The present disclosure provides methods and systems for antenna measurement. A signal output from a modulation/demodulation module may be combined with an intermediate frequency (IF) signal group that includes one or more IF signals. By adjusting the frequencies and quantity of IF signals in the IF signal group, measurements at one or more target operating frequencies of an antenna can be efficiently performed while keeping the measurement settings of the modulation/demodulation module unchanged or with minor adjustments.

According to a first aspect of the present disclosure, a method for measuring an antenna is provided. The method includes: providing a modulation/demodulation module, a signal analysis module, a signal combination module, a receiving antenna module, a signal generation module and an up/down conversion module; providing, via the modulation/demodulation module, a first signal including a first local oscillator (LO) signal; providing, via the signal analysis module, a first intermediate frequency (IF) signal group including at least one first IF signal; combining, via the signal combination module, the first signal with the first IF signal group to generate a second signal; providing, via the signal combination module, the second signal to an antenna module under test to generate a radio frequency (RF) signal, the antenna module under test including the antenna; receiving, via the receiving antenna module, the RF signal; providing, via the signal generation module, a second LO signal; demodulating, via the up/down conversion module, the RF signal by using the second LO signal to generate a second IF signal group; and processing, via the signal analysis module, the second IF signal group to obtain antenna measurement information of the antenna.

In some implementations of the first aspect of the present disclosure, the antenna module under test further includes at least one active circuit, and the first signal further includes a direct current (DC) power signal for powering the at least one active circuit and a digital control signal for controlling operations of the at least one active circuit.

In some implementations of the first aspect of the present disclosure, the digital control signal includes a Serial Peripheral Interface (SPI) signal.

In some implementations of the first aspect of the present disclosure, a frequency of the RF signal is determined based on a frequency of the first LO signal, a frequency of the at least one first IF signal, and a preset up-conversion factor.

In some implementations of the first aspect of the present disclosure, the first signal further includes at least one third IF signal.

In some implementations of the first aspect of the present disclosure, the frequency of the RF signal is further determined based on a frequency of the at least one third IF signal.

In some implementations of the first aspect of the present disclosure, the at least one active circuit includes a mixer configured to determine the preset up-conversion factor.

In some implementations of the first aspect of the present disclosure, the second LO signal and the first LO signal have a same frequency.

In some implementations of the first aspect of the present disclosure, the method further includes setting, via the signal analysis module, a frequency of the at least one first IF signal in the first IF signal group and a quantity of the at least one first IF signal in the first IF signal group based on one or more target operating frequencies of the antenna module under test.

According to a second aspect of the present disclosure, a system for measuring an antenna is provided. The system includes a modulation/demodulation module, a signal combination module, a signal analysis module, a receiving antenna module, a signal generation module, and an up/down conversion module. The modulation/demodulation module is configured to provide a first signal including a first local oscillator (LO) signal. The signal combination module is coupled to the modulation/demodulation module and configured to combine the first signal with a first intermediate frequency (IF) signal group to generate a second signal, where the first IF signal group includes at least one first IF signal. The signal analysis module is coupled to the signal combination module and configured to provide the first IF signal group. The receiving antenna module is configured to receive a radio frequency (RF) signal, where the RF signal is generated by an antenna module under test when the antenna module under test receives the second signal from the signal combination module. The antenna module under test includes the antenna. The signal generation module is configured to provide a second LO signal. The up/down conversion module is coupled to the receiving antenna module, the signal generation module, and the signal analysis module, and is configured to demodulate the RF signal by using the second LO signal to generate a second IF signal group. The signal analysis module is further configured to process the second IF signal group to obtain antenna measurement information of the antenna.

In some implementations of the second aspect of the present disclosure, the antenna module under test further includes at least one active circuit, and the first signal further includes a direct current (DC) power signal for powering the at least one active circuit and a digital control signal for controlling operations of the at least one active circuit.

In some implementations of the second aspect of the present disclosure, the digital control signal includes a Serial Peripheral Interface (SPI) signal.

In some implementations of the second aspect of the present disclosure, a frequency of the RF signal is determined based on a frequency of the first LO signal, a frequency of the at least one first IF signal, and a preset up-conversion factor.

In some implementations of the second aspect of the present disclosure, the first signal further includes at least one third IF signal.

In some implementations of the second aspect of the present disclosure, the frequency of the RF signal is further determined based on a frequency of the at least one third IF signal.

In some implementations of the second aspect of the present disclosure, the at least one active circuit includes a mixer configured to determine the preset up-conversion factor.

In some implementations of the second aspect of the present disclosure, the second LO signal and the first LO signal have a same frequency.

In some implementations of the second aspect of the present disclosure, the signal analysis module is configured to set a frequency of the at least one first IF signal in the first IF signal group and a quantity of the at least one first IF signal in the first IF signal group based on one or more target operating frequencies of the antenna module under test.

BRIEF DESCRIPTION OF THE DRAWINGS

Aspects of the present disclosure are best understood from the following detailed disclosure when read with the accompanying drawings. Various features are not drawn to scale. Dimensions of various features may be arbitrarily increased or reduced for clarity of discussion.

DESCRIPTION

The following description includes specific information regarding exemplary implementations of the present disclosure. The drawings and accompanying detailed descriptions in the present disclosure are directed to these exemplary implementations. However, the present disclosure is not limited to these exemplary implementations. Those skilled in the art will recognize other variations and implementations of the present disclosure. Furthermore, the drawings and illustrations in the present disclosure are generally not drawn to scale and may not correspond to actual relative dimensions.

The term "coupled" may be defined as connected, whether directly or indirectly through intermediate components, and is not necessarily limited to physical connections. When the terms "include" or "comprise" are used, they may mean "including but not limited to," explicitly indicating an open-ended relationship of combinations, groups, series, and equivalents.

The expression "at least one of A, B and C," "at least one of A, B or C," or "at least one of the following: A, B and C" means "only A, or only B, or only C, or any combination of A, B and C." The term "and/or" is only an association relationship for describing associated objects and represents that three relationships may exist such that A and/or B may indicate that A exists alone, A and B exist at the same time, or B exists alone. The character "/" generally represents that the associated objects are in an "or" relationship.

Figure 1:
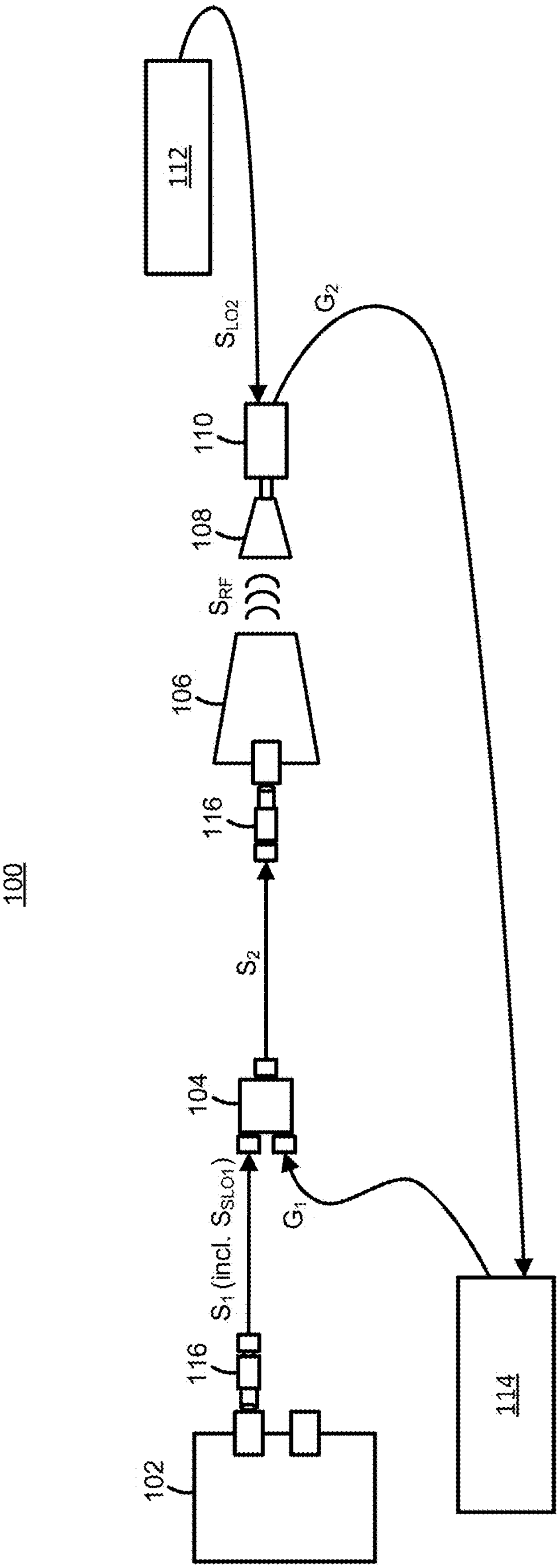
FIG. 1 is a schematic diagram illustrating a system for measuring an antenna, according to an example implementation of the present disclosure.

FIG. 1 is a schematic diagram illustrating a system 100 for measuring an antenna, according to an example implementation of the present disclosure. As shown in FIG. 1, the system 100 may include a modulation/demodulation module 102, a signal combination module 104, a receiving antenna module 108, an up/down conversion module 110, a signal generation module 112, and a signal analysis module 114. The system 100 may be configured to measure an antenna of an antenna module under test 106. Additionally, although not explicitly shown in FIG. 1, the system 100 may further include other components, such as bandpass filters, low noise amplifiers (LNA), and/or other signal processing components. For example, the receiving antenna module 108 may include an LNA to improve the signal-to-noise ratio of received signals.

During the measurement process of the system 100, the modulation/demodulation module 102 may provide a first signal $S_1$ to the signal combination module 104, where the first signal $S_1$ may include a first local oscillator (LO) signal $S_{LO1}$. The signal combination module 104 may combine the first signal $S_1$ with a first intermediate frequency (IF) signal group $G_1$ generated by the signal analysis module 114 to generate a second signal $S_2$, where the first IF signal group $G_1$ may include at least one first IF signal. The signal combination module 104 may then provide the second signal $S_2$ to the antenna module under test 106 for antenna measurement.

The antenna module under test 106 may generate and transmit a radio frequency (RF) signal $S_{RF}$ in response to receiving the second signal $S_2$. The receiving antenna module 108 may receive the RF signal $S_{RF}$ from the antenna module under test 106 and provide the received RF signal $S_{RF}$ to the up/down conversion module 110. Based on a second LO signal $S_{LO2}$ provided by the signal generation module 112, the up/down conversion module 110 may demodulate the RF signal $S_{RF}$ to generate a second IF signal group $G_2$ that includes at least one second IF signal.

The signal analysis module 114 may analyze and process the second IF signal group $G_2$ to obtain antenna measurement information of the antenna of the antenna module under test 106. For example, the signal analysis module 114 may measure the transmission and reflection characteristics of the antenna in the frequency domain based on the received signal, thereby deriving the antenna measurement information. In some implementations, the signal analysis module 114 may be implemented using a vector network analyzer. The signal analysis module 114 may be integrated with specialized signal processing hardware and/or software modules designed for specific measurement tasks. For example, dedicated digital signal processors may be employed to perform real-time spectral analysis, thus enabling more detailed characterization of the antenna's frequency response.

Based on the configuration of system 100, the frequency and quantity of first IF signals in the first IF signal group $G_1$ may be set to cause the antenna module under test 106 to generate RF signals $S_{RF}$ corresponding to different operating frequencies. This may enable users to complete multiple frequency measurements for the antenna module under test 106 in a single operation without changing (or with minor changes to) the system measurement settings.

The following describes exemplary implementations of each module in the system 100.

The modulation/demodulation module 102 may be implemented using a modem and/or hardware circuitry capable of performing modulation and demodulation functions. The modulation/demodulation module 102 may be configured to provide a first signal $S_1$ for antenna measurement. The first signal $S_1$ may include at least a first LO signal $S_{LO1}$. In some implementations, the first signal $S_1$ may further include a direct current (DC) power signal and a digital control signal. The DC power signal may power the active circuit(s) of the antenna module under test 106, while the digital control signal may control operations of the active circuit(s). The digital control signal may include, or be implemented as, a Serial Peripheral Interface (SPI) signal. The active circuit(s) of the antenna module under test 106 may include a mixer and/or other hardware circuits capable of performing frequency up-conversion operations.

The signal combination module 104 may be implemented using a power splitter, power divider, or other hardware components capable of combining multiple signals. The signal combination module 104 may be coupled to the modulation/demodulation module 102, the signal analysis module 114, and the antenna module under test 106. For example, physical connections between the signal combination module 104 and other modules may be established through cables with appropriate connectors 116, such as MiniFakra to 2.92 mm adapters based on the signal port specifications of the modules.

The signal combination module 104 may combine the first signal S1 from the modulation/demodulation module 102 with the first IF signal group G1 from the signal analysis module 114 to generate the second signal S2, and may provide the second signal S2 to antenna module under test 106. By adjusting the frequencies and quantity of first IF signals in the first IF signal group $G_1$, the system 100 may enable efficient multi-frequency measurements of the antenna module under test 106 while keeping the settings of the modulation/demodulation module 102 unchanged or with minor adjustments.

The antenna module under test 106 may generate the RF signal $S_{RF}$ in response to receiving the second signal $S_2$ from the signal combination module 104. As the signal combination module 104 combines the first signal $S_1$ with the first IF signal group $G_1$, the second signal S2 includes signal components from both sources, including the first LO signal $S_{LO1}$ from the first signal $S_1$ and the first IF signal(s) from the first IF signal group $G_1$.

In some implementations, the antenna module under test 106 may be designed to operate in conjunction with the modulation/demodulation module 102. For example, a matching operation relationship between the antenna module under test 106 and the modulation/demodulation module 102 may exist in a case that the active circuit(s) of the antenna module under test 106 is designed, based on specific protocols or specifications, to be powered and/or controlled by the modulation/demodulation module 102. Under the matching operation relationship, the active circuit(s) of the antenna module under test 106 may be powered by the DC power signal from the modulation/demodulation module 102, and may operate in response to the digital control signal from the modulation/demodulation module 102. Through the digital control signal, the modulation/demodulation module 102 may control one or more operational parameters of the antenna module under test 106, including working states of the active circuit(s), frequency response, and/or other adjustable circuit characteristics.

The frequency of the RF signal $S_{RF}$ generated by the antenna module under test 106 may be determined based on the frequency of the first LO signal $S_{LO1}$, the frequency of the at least one first IF signal in first IF signal group $G_1$, and a preset up-conversion factor. For example, the frequency of the RF signal $S_{RF}$ generated by the antenna module under test 106 may be determined based on the following formula (1):

$$f_{RF} = f_{LO} \times K + f_{IF}, \tag{1}$$

where $f_{RF}$ may represent an operating frequency of the RF signal $S_{RF}$, $f_{LO}$ may represent the frequency of the first LO signal $S_{LO1}$, fir may represent the frequency of one of the first IF signal(s) in the first IF signal group $G_1$, and K may represent the preset up-conversion factor.

It should be noted that the formula (1) merely represents one possible implementation without limiting the technical scope of the present disclosure. The antenna module under test 106 may employ other mathematical relationships or circuit designs, provided that the frequency of RF signal $S_{RF}$ is determined based on at least the three parameters ($f_{LO}$, $f_{IF}$, K). For example, in some implementations, the antenna module under test 106 may adopt a circuit design with multiple stages of up-conversion, where the frequency of the RF signal $S_{RF}$ may be determined based on $f_{RF}=(f_{LO}\times K_1)\times K_2+f_{IF}$, where $K_1$ and $K_2$ are preset up-conversion factors corresponding to different stages of the multi-stage up-conversion circuit, and the product of $K_1$ and $K_2$ may be equivalent to the preset up-conversion factor K in the formula (1). In some implementations, the antenna module under test 106 may adopt a design with a frequency offset, where the frequency of the RF signal $S_{RF}$ may be determined based on $f_{RF}=f_{LO}\times K+f_{IF}+f_{offset}$, where $f_{offset}$ is a preset frequency offset value. Although the various implementations may use different mathematical relationships, the frequency of the RF signal $S_{RF}$ may be determined based on the frequency of first LO signal $S_{LO1}$, the frequency of the first IF signal(s) in the first IF signal group $G_1$, and the preset up-conversion factor K.

In some implementations, the first signal $S_1$ may further include at least one third IF signal. In this case, the frequency of the RF signal $S_{RF}$ may be determined based on the frequency of the first LO signal $S_{LO1}$, the frequency of the at least one first IF signal in the first IF signal group $G_1$, the frequency of the at least one third IF signal, and the preset up-conversion factor. The $f_{IF}$ term in the formula (1) may represent either the frequency of any first IF signal in the first IF signal group $G_1$ or the frequency of any third IF signal in the first signal $S_1$. In other words, the $f_{IF}$ value in the formula (1) may be provided by IF signal frequencies from the first signal $S_1$ and the first IF signal group $G_1$.

For example, considering a case where the first LO signal $S_{LO1}$ has a frequency of 7.5 GHz and the preset up-conversion factor K is 6. If the first signal $S_1$ includes a third IF signal at 15 GHZ, based on measurement settings of the modulation/demodulation module 102, then the first IF signal group $G_1$ that is generated by the signal analysis module 114 may only need to contain first IF signals at 14 GHz, 15.5 GHZ, and 16 GHz. With this configuration, the antenna module under test 106 may generate RF signals at four target operating frequencies: 59 GHz, 60 GHz, 60.5 GHz, and 61 GHz. Among these target operating frequencies, the 60 GHz operating frequency corresponds to the third IF signal in the first signal $S_1$, while the operating frequencies of 59 GHz, 60.5 GHZ, and 61 GHz correspond to the first IF signals at 14 GHz, 15.5 GHZ, and 16 GHz in the first IF signal group $G_1$, respectively.

The preset up-conversion factor K may be determined by the mixer in the active circuit(s) of the antenna module under test 106. For example, when the modulation/demodulation module 102 outputs a first LO signal $S_{LO1}$ with a frequency ($f_{LO}$) of 7.5 GHZ, the signal analysis module 114 generates a first IF signal group $G_1$ including multiple first IF signals with frequencies ($f_{IF}$) of 14 GHZ, 15 GHz, 15.5 GHZ, and 16 GHZ, and the active circuit(s) of the antenna module under test 106 has a preset up-conversion factor K=6, then according to the formula (1), the antenna module under test 106 may generate an RF signal $S_{RF}$ with operating frequencies of 59 GHz (=7.5×6+14), 60 GHz (=7.5×6+15), 60.5 GHZ (=7.5×6+15.5), and 61 GHz (=7.5×6+16).

The first IF signal group $G_1$ may be implemented in different ways. In one implementation, the first IF signal group $G_1$ may be a mixed signal simultaneously containing one or multiple frequency components in the frequency domain. For example, for target operating frequencies of 59 GHz, 60 GHz, 60.5 GHZ, and 61 GHz, the mixed signal may contain corresponding frequency components of 14 GHz, 15 GHz, 15.5 GHz, and 16 GHz, where each frequency component may correspond to a first IF signal. The signal analysis module 114 may provide the mixed signal to the signal combination module 104 as a single signal. In this case, the antenna module under test 106 may generate an RF signal $S_{RF}$ that simultaneously contains the multiple operating frequencies of 59 GHz, 60 GHz, 60.5 GHZ, and 61 GHz (assuming $f_{LO}$)=7.5 GHz and K=6). In another implementation, the signal analysis module 114 may provide first IF signals sequentially to the signal combination module 104. In this case, for the same target operating frequencies, the signal analysis module 114 may sequentially generate the first IF signals at 14 GHz, 15 GHz, 15.5 GHz, and 16 GHz, thus enabling the antenna module under test 106 to sequentially generate the RF signals $S_{RF}$ at the corresponding operating frequencies of 59 GHz, 60 GHz, 60.5 GHZ, and 61 GHz (assuming $f_{LO}$=7.5 GHz and K=6).

The receiving antenna module 108 may receive the RF signal $S_{RF}$ generated by the antenna module under test 106. The receiving antenna module 108 may be implemented using various forms of antennas or antenna arrays, depending on actual application requirements and operating frequency ranges.

The up/down conversion module 110 may be coupled to the receiving antenna module 108, the signal generation module 112, and the signal analysis module 114. The up/down conversion module 110 may be configured to demodulate the RF signal $S_{RF}$ by using a second LO signal $S_{LO2}$ that is generated by the signal generation module 112, thus generating and providing the second IF signal group $G_2$ to the signal analysis module 114. In some implementations, the up/down conversion module 110 may be implemented using an up/down converter (UDC) and/or other hardware circuitry designed for down-converting the received antenna measurement signals (e.g., the RF signal $S_{RF}$ from the antenna module under test 106).

The second IF signal group $G_2$ may include one or more second IF signals. Similar to the form of the first IF signal group $G_1$, in one implementation, the second IF signal group $G_2$ may be a mixed signal containing one or multiple frequency components, where each frequency component may correspond to a second IF signal. In another implementation, the second IF signal group $G_2$ may include one or multiple frequency signals generated in sequence, where each frequency signal may correspond to a second IF signal.

The signal generation module 112 may be configured to provide the second LO signal $S_{LO2}$. In some implementations, the frequency of the second LO signal $S_{LO2}$ may be the same, or substantially the same, as the frequency of first LO signal $S_{LO1}$, for use in demodulating the RF signal $S_{RF}$. The term "substantially the same frequency" may refer to a frequency difference that falls within an allowable error range, which may result from variations in circuit component characteristics, environmental temperature fluctuations, or other system factors. When the RF signal $S_{RF}$ is correctly demodulated, each second IF signal in the second IF signal group $G_2$ may correspond one-to-one with a first IF signal in the first IF signal group $G_1$.

The signal generation module 112 may be implemented using a Phase-Locked Loop (PLL) circuit, Voltage-Controlled Oscillator (VCO) circuit, and/or other circuits configured to generate LO signals with specific frequencies. In some implementations, the first LO signal $S_{LO1}$ and the second LO signal $S_{LO2}$ provided to the system 100 may originate from the same signal source to ensure that their frequencies remain the same or substantially the same. In this configuration, some or all functions of the signal generation module 112 may be integrated with the modulation/demodulation module 102 into a single module.

The signal analysis module 114 may be configured to receive the second IF signal group $G_2$ from the up/down conversion module 110 and provide the first IF signal group $G_1$ to the signal combination module 104. The signal analysis module 114 may process the second IF signal group $G_2$ to obtain the antenna measurement information, where the antenna measurement information may include at least one of S-parameters (such as S11 and S21), return loss, insertion loss, or other network analysis data related to the antenna of the antenna module under test 106. For example, to obtain the antenna measurement information, the signal analysis module 114 may perform frequency-domain analysis on the second IF signal group $G_2$, thus enabling the extraction of relevant network parameters for evaluating the antenna's impedance matching, efficiency, and overall performance.

In some implementations, the signal analysis module 114 may set the frequency and quantity of first IF signals in the first IF signal group $G_1$ based on the target operating frequencies of the antenna module under test 106. For example, if the target operating frequencies of the antenna module under test 106 are 59 GHz, 60 GHz, 60.5 GHZ, and 61 GHz, and the frequency of the first LO signal $S_{LO1}$ is 7.5 GHz with a preset up-conversion factor K of 6, then according to the formula (1), $f_{RF}=f_{LO}\times K+f_{IF}$, the required frequencies of the first IF signals may be determined to be 14 GHz, 15 GHZ, 15.5 GHZ, and 16 GHz. Accordingly, the signal analysis module 114 may generate the first IF signal group G1 containing these four frequency components (first IF signals) to enable the antenna module under test 106 to generate the RF signal $S_{RF}$ with the desired target operating frequencies.

In some implementations, the functions of the signal generation module 112 and the signal analysis module 114 may be integrated into a single vector network analyzer. Alternatively or additionally, the modulation/demodulation module 102 may incorporate signal generation functionality to directly generate both the first LO signal $S_{LO1}$ and the second LO signal $S_{LO2}$. Alternatively or additionally, the signal combination module 104 may be integrated into the modulation/demodulation module 102 to create a single module that performs multiple signal integration functions.

Figure 2:
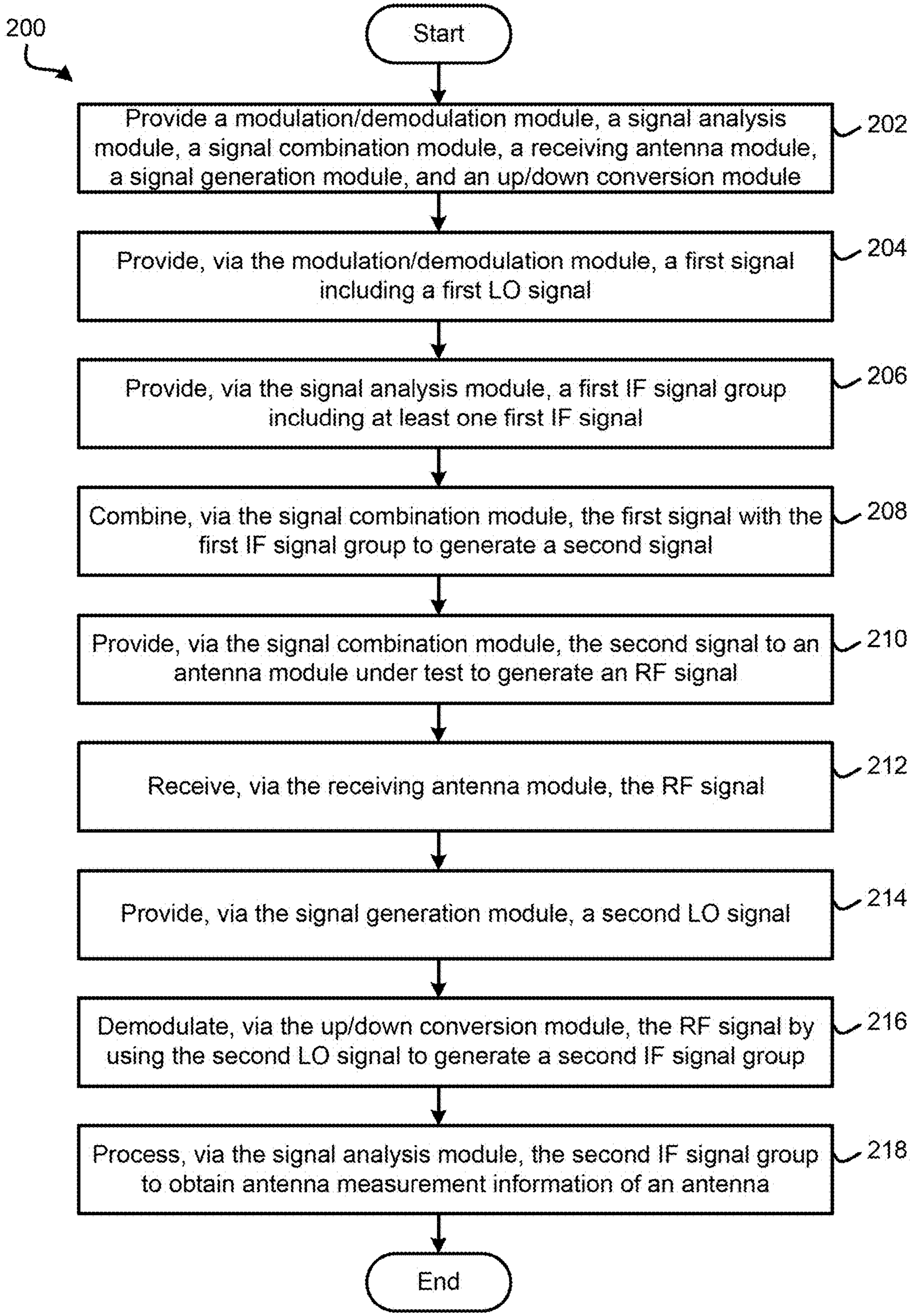
FIG. 2 is a flowchart illustrating a method for measuring an antenna, according to an example implementation of the present disclosure.

FIG. 2 is a flowchart illustrating a method 200 for measuring an antenna, according to an example implementation of the present disclosure. The method 200 may be applied to the system 100 as illustrated in FIG. 1. In the following description of method 200, the same reference numerals are used to denote the same or corresponding components or modules as described with respect to system 100. Although actions 202, 204, 206, 208, 210, 212, 214, 216, and 218 are illustrated, as separate actions, represented as independent blocks in FIG. 2, these separately illustrated actions should not be construed as to be necessarily order-dependent. The order in which the actions are performed in FIG. 2 is not intended to be construed as a limitation, and any number of the disclosed blocks may be combined in any order to implement the method, or an alternative method. Each of actions 202, 204, 206, 208, 210, 212, 214, 216, and 218 may be performed independent of the other actions, and may be omitted in some implementations of the present disclosure.

In action 202, a modulation/demodulation module 102, a signal analysis module 114, a signal combination module 104, a receiving antenna module 106, a signal generation module 112, and an up/down conversion module 110 may be provided.

In action 204, a first signal $S_1$ including a first LO signal $S_{LO1}$ may be provided via the modulation/demodulation module 102.

In action 206, a first IF signal group $G_1$ including at least one first IF signal may be provided via the signal analysis module 114.

In action 208, the first signal $S_1$ may be combined with the first IF signal group $G_1$, via the signal combination module 104, to generate a second signal $S_2$.

In action 210, the second signal $S_2$ may be provided, via the signal combination module 104, to the antenna module under test 106 to generate an RF signal $S_{RF}$. The antenna module under test 106 may include the antenna to be measured by the system 100.

In action 212, the RF signal $S_{RF}$ may be received via the receiving antenna module 108.

In action 214, a second LO signal $S_{LO2}$ may be provided via the signal generation module 112.

In action 216, the RF signal $S_{RF}$ may be demodulated, via the up/down conversion module 110, based on the second LO signal $S_{LO2}$ to generate a second IF signal group $G_2$.

In action 218, the second IF signal group $G_2$ may be processed, via the signal analysis module 114, to obtain antenna measurement information of the antenna.

Implementation of the method 200 may effectively improve antenna measurement efficiency. The method 200 may utilize the innovative architecture of the system 100, where the signal combination module 104 may combine the first signal $S_1$ from the modulation/demodulation module 102 with the first IF signal group $G_1$ from the signal analysis module 114. By adjusting the frequencies and quantity of signals in the first IF signal group $G_1$, measurements at multiple target operating frequencies may be efficiently performed while keeping the settings of the modulation/demodulation module 102 unchanged or with minor adjustments.

Furthermore, for scenarios where the antenna module under test 106 is designed to operate in conjunction with the modulation/demodulation module 102 (e.g., when a matching operation relationship exists between the antenna module under test 106 and the modulation/demodulation module 102), the method 200 may provide enhanced effectiveness in performing multi-frequency measurements. The signal analysis module 114 may flexibly adjust the first IF signal group G1 based on the target operating frequencies, thus enabling the antenna module under test 106 to generate RF signals $S_{RF}$ at corresponding frequencies. This measurement approach may not only enhance measurement efficiency but may also ensure measurement consistency and reliability.

In view of the present disclosure, it is obvious that various techniques may be used for implementing the disclosed concepts without departing from the scope of those concepts. Moreover, while the concepts have been disclosed with specific reference to certain implementations, a person of ordinary skill in the art may recognize that changes may be made in form and detail without departing from the scope of those concepts. As such, the disclosed implementations are to be considered in all respects as illustrative and not restrictive. It should also be understood that the present disclosure is not limited to the particular implementations disclosed and many rearrangements, modifications, and substitutions are possible without departing from the scope of the present disclosure.

What is claimed is:

1. A method for measuring an antenna, the method comprising:

providing a modulation/demodulation module, a signal analysis module, a signal combination module, a receiving antenna module, a signal generation module and an up/down conversion module;

providing, via the modulation/demodulation module, a first signal comprising a first local oscillator (LO) signal;

providing, via the signal analysis module, a first intermediate frequency (IF) signal group comprising at least one first IF signal;

combining, via the signal combination module, the first signal with the first IF signal group to generate a second signal;

providing, via the signal combination module, the second signal to an antenna module under test to generate a radio frequency (RF) signal, the antenna module under test comprising the antenna;

receiving, via the receiving antenna module, the RF signal;

providing, via the signal generation module, a second LO signal;

demodulating, via the up/down conversion module, the RF signal by using the second LO signal to generate a second IF signal group; and processing, via the signal analysis module, the second IF signal group to obtain antenna measurement information of the antenna.

2. The method of claim 1, wherein the antenna module under test further comprises at least one active circuit, and the first signal further comprises a direct current (DC) power signal for powering the at least one active circuit and a digital control signal for controlling operations of the at least one active circuit.

3. The method of claim 2, wherein the digital control signal comprises a Serial Peripheral Interface (SPI) signal.

4. The method of claim 2, wherein a frequency of the RF signal is determined based on a frequency of the first LO signal, a frequency of the at least one first IF signal, and a preset up-conversion factor.

5. The method of claim 4, wherein the first signal further comprises at least one third IF signal.

6. The method of claim 5, wherein the frequency of the RF signal is further determined based on a frequency of the at least one third IF signal.

7. The method of claim 4, wherein the at least one active circuit comprises a mixer configured to determine the preset up-conversion factor.

8. The method of claim 1, wherein the second LO signal and the first LO signal have a same frequency.

9. The method of claim 1, further comprising:

setting, via the signal analysis module, a frequency of the at least one first IF signal in the first IF signal group and a quantity of the at least one first IF signal in the first IF signal group based on one or more target operating frequencies of the antenna module under test.

10. A system for measuring an antenna, the system comprising:

a modulation/demodulation module configured to provide a first signal comprising a first local oscillator (LO) signal;

a signal combination module coupled to the modulation/demodulation module and configured to combine the first signal with a first intermediate frequency (IF) signal group to generate a second signal, the first IF signal group comprising at least one first IF signal;

a signal analysis module coupled to the signal combination module and configured to provide the first IF signal group;

a receiving antenna module configured to receive a radio frequency (RF) signal, wherein the RF signal is generated by an antenna module under test when the antenna module under test receives the second signal from the signal combination module, wherein the antenna module under test comprises the antenna;

a signal generation module configured to provide a second LO signal; and an up/down conversion module coupled to the receiving antenna module, the signal generation module, and the signal analysis module, and configured to demodulate the RF signal by using the second LO signal to generate a second IF signal group, wherein the signal analysis module is further configured to process the second IF signal group to obtain antenna measurement information of the antenna.

11. The system of claim 10, wherein the antenna module under test further comprises at least one active circuit, and the first signal further comprises a direct current (DC) power signal for powering the at least one active circuit and a digital control signal for controlling operations of the at least one active circuit.

12. The system of claim 11, wherein the digital control signal comprises a Serial Peripheral Interface (SPI) signal.

13. The system of claim 11, wherein a frequency of the RF signal is determined based on a frequency of the first LO signal, a frequency of the at least one first IF signal, and a preset up-conversion factor.

14. The system of claim 13, wherein the first signal further comprises at least one third IF signal.

15. The system of claim 14, wherein the frequency of the RF signal is further determined based on a frequency of the at least one third IF signal.

16. The system of claim 13, wherein the at least one active circuit comprises a mixer configured to determine the preset up-conversion factor.

17. The system of claim 10, wherein the second LO signal and the first LO signal have a same frequency.

18. The system of claim 10, wherein the signal analysis module is configured to set a frequency of the at least one first IF signal in the first IF signal group and a quantity of the at least one first IF signal in the first IF signal group based on one or more target operating frequencies of the antenna module under test.

* * * * *